United States Patent
Sekiya

(10) Patent No.: US 8,016,643 B2
(45) Date of Patent: Sep. 13, 2011

(54) WAFER GRINDING METHOD

(75) Inventor: Kazuma Sekiya, Tokyo (JP)

(73) Assignee: Disco Corporation, Tokyo (JP)

( * ) Notice: Subject to any disclaimer, the term of this patent is extended or adjusted under 35 U.S.C. 154(b) by 659 days.

(21) Appl. No.: 11/959,040

(22) Filed: Dec. 18, 2007

(65) Prior Publication Data

US 2008/0176491 A1 Jul. 24, 2008

(30) Foreign Application Priority Data

Jan. 24, 2007 (JP) .................... 2007-013624

(51) Int. Cl.
*B24B 1/00* (2006.01)

(52) U.S. Cl. .................. 451/41; 451/54; 438/465

(58) Field of Classification Search .......... 451/41, 451/54; 438/462, 464, 465
See application file for complete search history.

(56) References Cited

U.S. PATENT DOCUMENTS

| 6,329,288 | B1 * | 12/2001 | Tokushige et al. | 438/675 |
| 6,534,387 | B1 * | 3/2003 | Shinogi et al. | 438/465 |
| 6,982,141 | B2 * | 1/2006 | Nogome et al. | 430/311 |
| 2002/0106868 | A1 * | 8/2002 | Saimoto et al. | 438/459 |
| 2002/0127821 | A1 * | 9/2002 | Ohya et al. | 438/459 |
| 2004/0092108 | A1 * | 5/2004 | Yajima et al. | 438/689 |
| 2007/0184660 | A1 * | 8/2007 | Fujimura | 438/691 |

FOREIGN PATENT DOCUMENTS

| JP | 2002064116 A | * | 2/2002 |
| JP | 2006-075929 | | 3/2006 |

OTHER PUBLICATIONS

English language Abstract of Jp 2006-075929.

* cited by examiner

*Primary Examiner* — Maurina Rachuba
(74) *Attorney, Agent, or Firm* — Greenblum & Bernstein P.L.C.

(57) ABSTRACT

A method of grinding the rear surface of a wafer having a plurality of dividing lines which are formed in a lattice pattern on the front surface and devices which are formed in a plurality of areas sectioned by the plurality of dividing lines, comprising a protective film forming step for forming a protective film by coating the front surface of the wafer with a liquid resin; a flattening step for scraping the front surface of the protective film formed on the front surface of the wafer to flatten the protective film; and a rear surface grinding step for placing the protective film side of the wafer on the holding surface of a chuck table for holding a wafer and grinding the rear surface of the wafer by a grinding means to a predetermined thickness.

5 Claims, 7 Drawing Sheets

(a)

(b)

WAFER GRINDING METHOD

FIELD OF THE INVENTION

The present invention relates to a method of grinding a wafer such as a semiconductor wafer to a predetermined thickness.

DESCRIPTION OF THE PRIOR ART

In the production process of a semiconductor device, a plurality of areas are sectioned by dividing lines called "streets" arranged in a lattice pattern on the front surface of a substantially disk-like semiconductor wafer, and a device such as IC, LSI or the like is formed in each of the sectioned areas. Individual semiconductor chips are manufactured by cutting this semiconductor wafer along the streets to divide it into the areas each having a device formed therein. An optical device wafer comprising a gallium nitride-based compound semiconductor laminated on the front surface of a sapphire substrate is also cut along streets to be divided into individual optical devices such as light emitting diodes or laser diodes which are widely used in electric appliances. The rear surface of the wafer to be divided as described above is ground to a predetermined thickness by a grinding machine before it is cut along the streets.

To grind the rear surface of the wafer, as disclosed by JP-A 2006-75929, for example, a protective tape is affixed to the front surface of the wafer, the protective tape side of the wafer is placed on the chuck table of a grinding machine, and a grinding wheel that is rotating is brought into contact with the rear surface of the wafer and moved down (grinding-fed) a predetermined distance while the chuck table is rotated to grind the wafer to a predetermined thickness.

The protective tape affixed to the front surface of the wafer is a resin film such as a polyvinyl chloride (PVC) film having a thickness of about 80 μm. However, the film is not uniform in thickness and its thickness varies from place to place. As the protective tape has thus variation in thickness, when the rear surface of the wafer is ground as described above, it is ground in accordance with variation in the thickness of the protective tape, thereby making it impossible to flatten the rear surface of the wafer.

SUMMARY OF THE INVENTION

It is an object of the present invention to provide a wafer grinding method capable of flattening the rear surface of a wafer.

To attain the above object, according to the present invention, there is provided a method of grinding the rear surface of a wafer having a plurality of dividing lines which are formed in a lattice pattern on the front surface and devices which are formed in a plurality of areas sectioned by the plurality of dividing lines, comprising:

a protective film forming step for forming a protective film by coating the front surface of the wafer with a liquid resin;

a flattening step for scraping the front surface of the protective film formed on the front surface of the wafer to flatten the protective film; and a rear surface grinding step for placing the protective film side of the wafer on the holding surface of a chuck table for holding a wafer and grinding the rear surface of the wafer by a grinding means to a predetermined thickness.

According to the present invention, there is further provided a wafer grinding method wherein a groove having a depth corresponding to the final thickness of each device is formed along the plurality of dividing lines from the front surface side of the wafer before the above protective film forming step, the above protective film forming step and the above flattening step are then carried out, and the grooves are exposed to the rear surface of the wafer in the rear surface grinding step to divide the wafer into individual devices along the plurality of dividing lines.

A step of removing the protective film formed on the front surface of the wafer is carried out after the above rear surface grinding step.

According to the present invention, there is also provided a method of grinding the rear surface of a wafer having a plurality of dividing lines which are formed in a lattice pattern on the front surface, devices which are formed in a plurality of areas sectioned by the plurality of dividing lines and a plurality of electrodes which are formed on each of the devices, comprising:

a protective film forming step for forming a protective film thick enough to cover the electrodes by coating the front surface of the wafer with a liquid resin;

a flattening step for scraping the front surface of the protective film formed on the front surface of the wafer to form a flat surface from which the electrodes are not exposed;

a rear surface grinding step for placing the protective film side of the wafer on the holding surface of a chuck table for holding a wafer and grinding the rear surface of the wafer by a grinding means to a predetermined thickness; and an electrode exposing step for scraping the front surface of the protective film formed on the front surface of the wafer to expose the electrodes after the rear surface grinding step.

According to the wafer grinding method of the present invention, since the front surface of the protective film placed on the chuck table has been made flat by the flattening step, the rear surface of the wafer is ground flat in the rear surface grinding step.

DETAILED DESCRIPTION OF THE PREFERRED EMBODIMENTS

Preferred embodiments of the wafer grinding method of the present invention will be described in more detail hereinunder with reference to the accompanying drawings.

Figure 1:
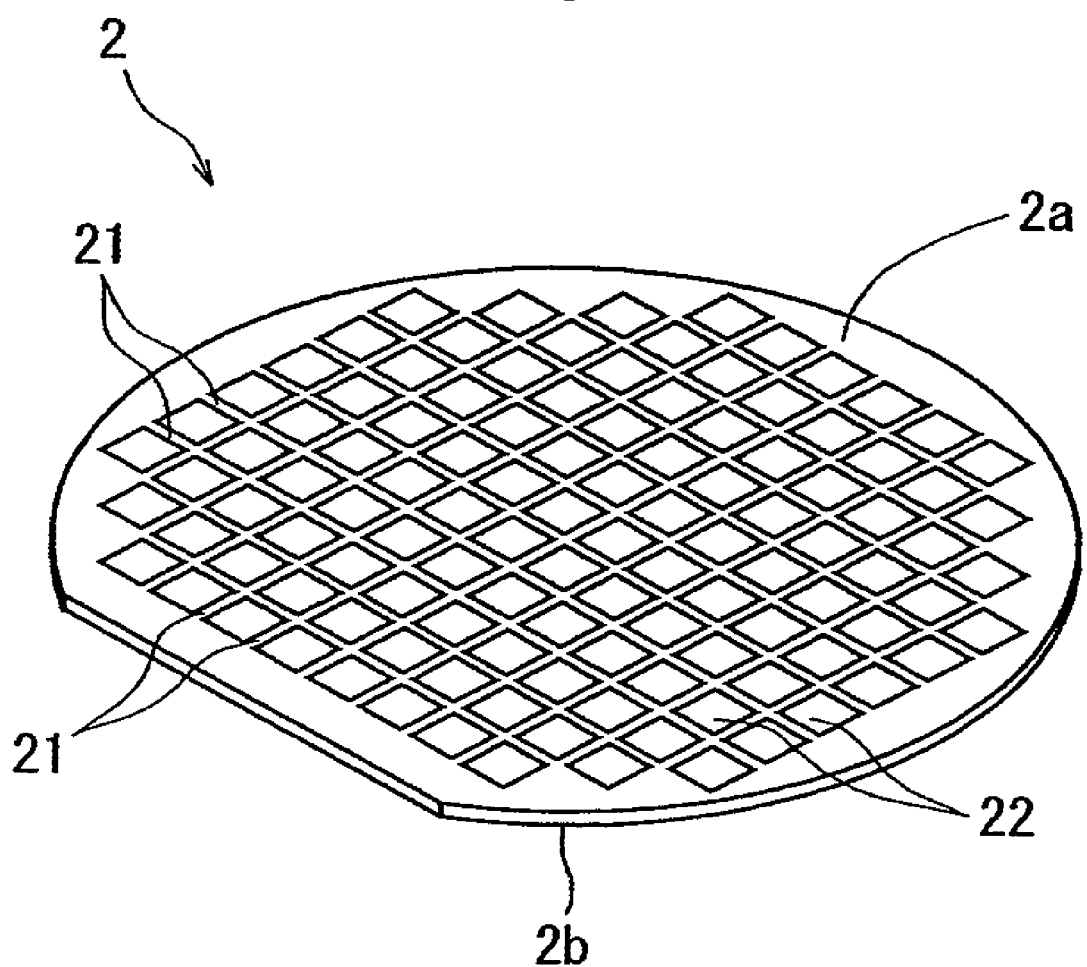
FIG. 1 is a perspective view of a semiconductor wafer to be processed by the wafer grinding method of the present invention.
Figure 2:
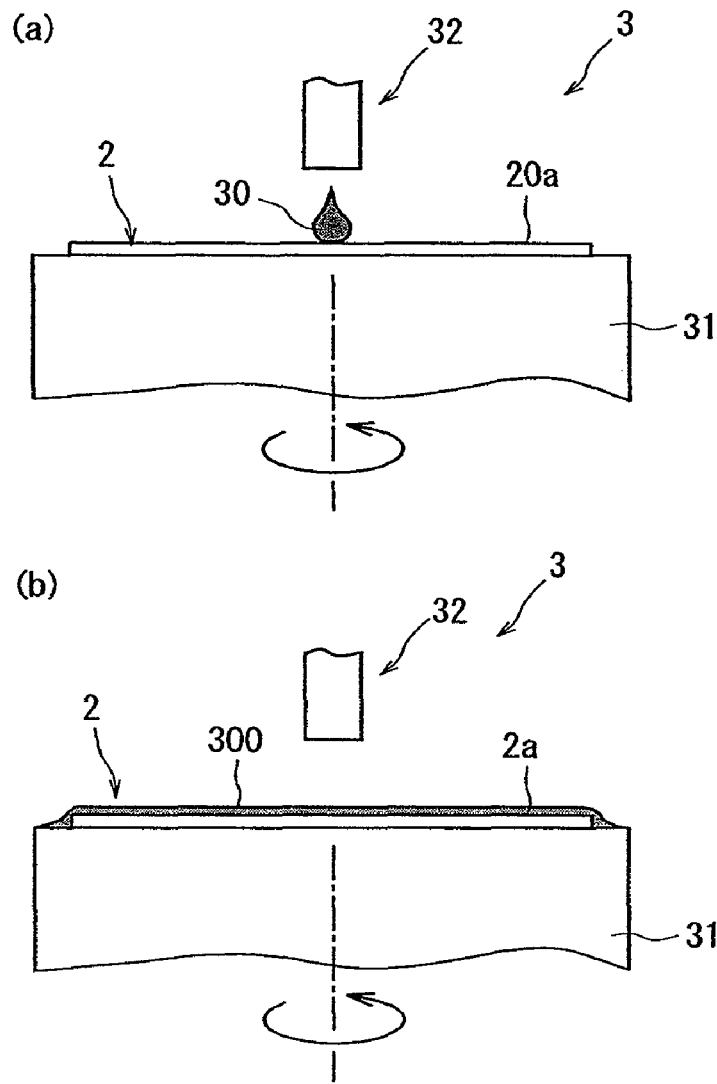
FIGS. 2(a) and 2(b) are explanatory diagrams showing a protective film forming step in a first embodiment of the wafer grinding method of the present invention.

FIG. 1 is a perspective view of a semiconductor wafer as a workpiece. The semiconductor wafer 2 shown in FIG. 1 is, for example, a silicon wafer having a thickness of 300 µm, a plurality of dividing lines 21 are formed in a lattice pattern on the front surface 2a, and a device 22 such as IC or LSI is formed in a plurality of areas sectioned by the plurality of dividing lines 21.

The rear surface 2b of the above-described semiconductor wafer 2 is ground to a predetermined thickness. A description will be subsequently given of a first embodiment of the method of grinding the rear surface 2b of this semiconductor wafer 2 according to the present invention with reference to FIGS. 2 to 8.

First comes the step of forming a protective film by coating the front surface 2a of the semiconductor wafer 2 with a liquid resin. This protective film forming step is carried out by using a protective film forming apparatus 3 shown in FIGS. 2(a) and 2(b). The protective film forming apparatus 3 shown in FIGS. 2(a) and 2(b) comprises a spinner table 31 for holding a wafer and a resin liquid supply nozzle 32 located above the center of rotation of the spinner table 31. The rear surface 2b side of the semiconductor wafer 2 is placed on the spinner table 31 of the protective film forming apparatus 3 constituted as described above. A suction means (not shown) is then activated to suction-hold the semiconductor wafer 2 on the spinner table 31. Therefore, the front surface 2a of the semiconductor wafer 2 held on the spinner table 31 faces up. After the semiconductor wafer 2 is held on the spinner table 31, a predetermined amount of a liquid resin 30 is dropped on the center area of the front surface 2a of the semiconductor wafer 2 from the resin liquid supply nozzle 32 located above the spinner table 31 while the spinner table 31 is rotated at a predetermined revolution (for example, 300 to 1,000 rpm) in the direction indicated by the arrow, as shown in FIG. 2(a). By rotating the spinner table 31 for 60 seconds, a protective film 300 is formed on the front surface 2a of the semiconductor wafer 2, as shown in FIG. 2(b). The thickness of the protective film 300 formed on the front surface 2a of the semiconductor wafer 2 is determined by the amount of the above liquid resin 30 dropped on the semiconductor wafer 2 and may be about 50 µm. As the liquid resin 30 may be used ethylene carbonate, epoxy resin, resist resin or the like.

Figure 3:
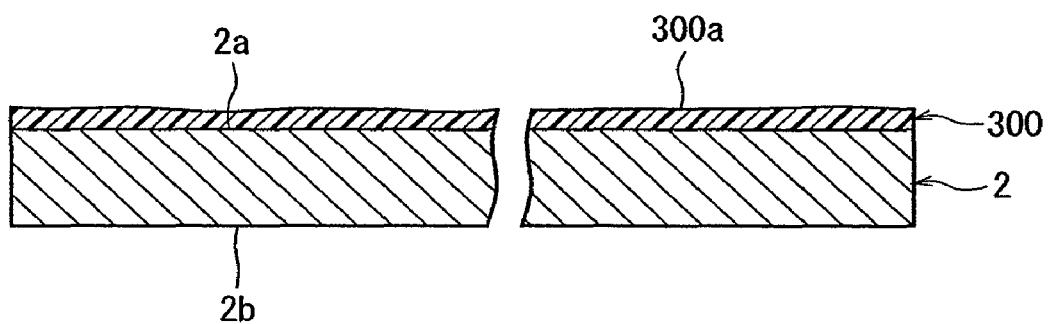
FIG. 3 is an enlarged sectional view of the semiconductor wafer which has been subjected to the protective film forming step shown in FIGS. 2(a) and 2(b)
Figure 4:
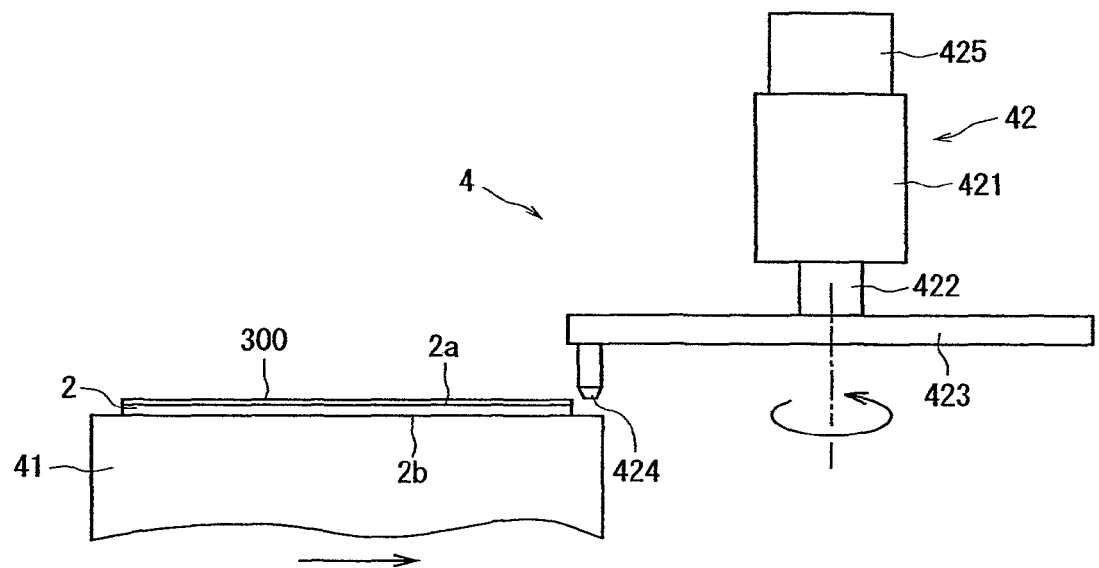
FIG. 4 is an explanatory diagram showing a flattening step in the first embodiment of the wafer grinding method of the present invention.
Figure 5:
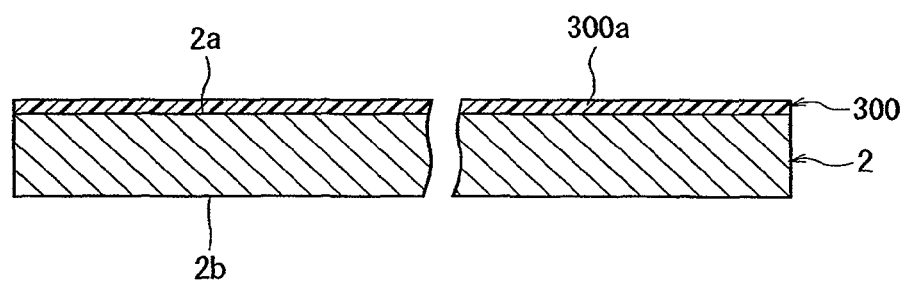
FIG. 5 is an enlarged sectional view of the semiconductor wafer which has been subjected to the flattening step shown in FIG. 4.

The front surface 300a of the protective film 300 formed on the front surface 2a of the semiconductor wafer 2 by carrying out the above protective film forming step is not flat as shown in FIG. 3. Therefore, after the protective film 300 formed on the front surface 2a of the semiconductor wafer 2 becomes dry and is solidified, next comes the step of flattening the front surface 300a. This flattening step is carried out by using a scraping machine 4 shown in FIG. 4. The scraping machine 4 shown in FIG. 4 comprises a chuck table 41 for holding a wafer and a scraping means 42 for scraping the wafer held on the chuck table 41. The chuck table 41 can be moved in the horizontal direction in FIG. 4 by a moving means that is not shown. The scraping means 42 comprises a spindle housing 421, a rotary spindle 422 rotatably supported in the spindle housing 421, a tool attaching mounter 423 mounted on the lower end of the rotary spindle 422, a scraping tool 424 mounted on the mounter 423, and a servo motor 425 for driving the above rotary spindle 422. The rear surface 2b side of the semiconductor wafer 2 is placed on the chuck table 41 of the scraping machine 4 constituted as described above. The suction means (not shown) is then activated to suction-hold the semiconductor wafer 2 on the chuck table 41. Therefore, the protective film 300 formed on the front surface 2a of the semiconductor wafer 2 held on the chuck table 41 faces up. After the semiconductor wafer 2 is held on the chuck table 41, the rotary spindle 422 is rotated in the direction indicated by the arrow, as shown in FIG. 4 and at the same time, the scraping means 42 is moved down a predetermined distance for scraping and the chuck table 41 is moved in the direction indicated by the arrow at a predetermined speed. As a result, the surface portion of the protective film 300 formed on the front surface 2a of the semiconductor wafer 2 held on the chuck table 41 is scraped away with the scraping tool 424, whereby the front surface 300a is made flat as shown in FIG. 5.

Figure 6:
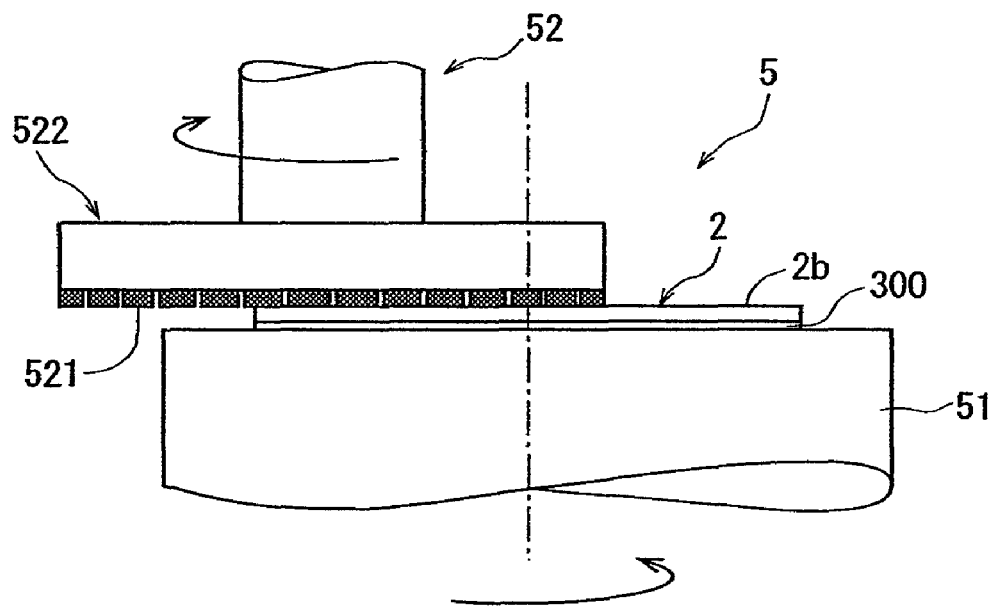
FIG. 6 is an explanatory diagram showing a rear surface grinding step in the first embodiment of the wafer grinding method of the present invention.
Figure 7:
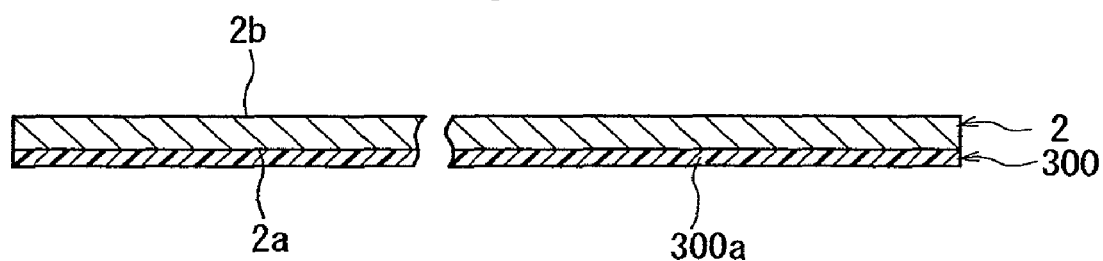
FIG. 7 is an enlarged sectional view of the semiconductor wafer which has been subjected to the rear surface grinding step shown in FIG. 6.

The above flattening step is followed by the step of grinding the rear surface 2b of the semiconductor wafer 2 to reduce the thickness of the semiconductor wafer 2 to a predetermined value. This rear surface grinding step is carried out by using a grinding machine 5 shown in FIG. 6. The grinding machine 5 shown in FIG. 6 comprises a chuck table 51 for holding a wafer and a grinding means 52 having a grinding tool 522 with a grindstone 521 for grinding the wafer held on the chuck table 51. In the rear surface grinding step, the protective film 300 side of the semiconductor wafer 2 which has been subjected to the above flattening step is placed on the chuck table 51 of the grinding machine 5. The suction means (not shown) is then activated to suction-hold the semiconductor wafer 2 on the chuck table 51. Therefore, the rear surface 2b of the semiconductor wafer 2 held on the chuck table 51 faces up. After the semiconductor wafer 2 is held on the chuck table 51 as described above, the grinding tool 522 is rotated at 6,000 rpm, for example, brought into contact with the rear surface 2b of the semiconductor wafer 2 and moved down (grinding-fed) a predetermined distance while the chuck table 51 is rotated at 300 rpm, for example, to grind the rear surface 2b of the semiconductor wafer 2 to a predetermined thickness (for example, 100 µm), as shown in FIG. 6. Since the front surface 300a of the protective film 300 placed on the chuck table 51 has been made flat by the above flattening step, the rear surface 2b of the semiconductor wafer 2 is ground flat as shown in FIG. 7 in this rear surface grinding step.

Figure 8:
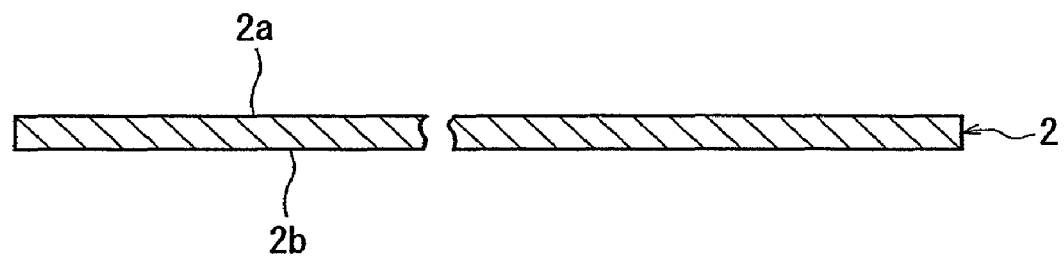
FIG. 8 is an enlarged sectional view of the semiconductor wafer which has been subjected to a protective film removing step in the first embodiment of the wafer grinding method of the present invention.

The above rear surface grinding step is followed by the step of removing the protective film 300 formed on the front surface 2a of the semiconductor wafer 2. In this protective film removing step, the protective film 300 is removed by dissolving it in a solvent, for example. Therefore, the resin forming the protective film 300 is desirably water-soluble. By carrying out this protective film removing step, as described above, the semiconductor wafer 2 whose rear surface 2b has been ground flat to a predetermined thickness as shown in FIG. 8 is obtained. The semiconductor wafer 2 thus having the predetermined thickness is divided into individual devices in the subsequent dividing step.

A description will be subsequently given of a second embodiment of the wafer grinding method of the present invention.

In the second embodiment of the wafer grinding method, the step of forming a dividing groove having a depth corresponding to the final thickness of each device along the plurality of dividing lines 21 on the front surface 2a side of the semiconductor wafer 2 is carried out before the above protective film forming step. This dividing groove forming step can be carried out by using a cutting machine 6 shown in FIG. 9(a). This cutting machine 6 shown in FIG. 9(a) comprises a chuck table 61 for holding a wafer, a cutting means 62 having a cutting blade 621, and an image pick-up means 63. The rear surface 2b side of the semiconductor wafer 2 is placed on the chuck table 61 of the cutting machine 6 constituted as described above. The suction means (not shown) is then activated to suction-hold the semiconductor wafer 2 on the chuck table 61. Therefore, the front surface 2a of the semiconductor wafer 2 held on the chuck table 61 faces up. The chuck table 61 suction-holding the semiconductor wafer 2 is brought to a position right below the image pick-up means 63 by a cutting-feed mechanism that is not shown.

Figure 9:
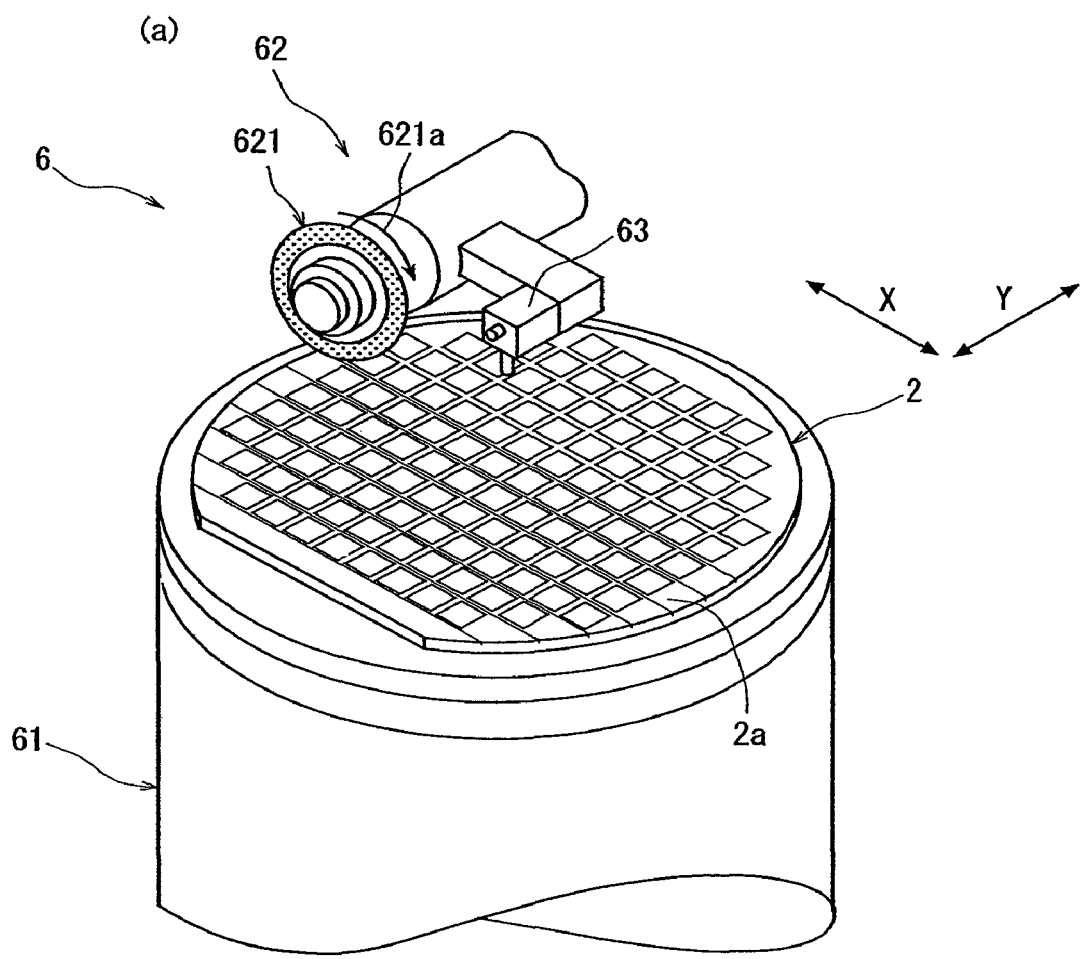
FIGS. 9(a) and 9(b) are explanatory diagrams showing a dividing groove forming step in a second embodiment of the wafer grinding method of the present invention.
Figure 9:
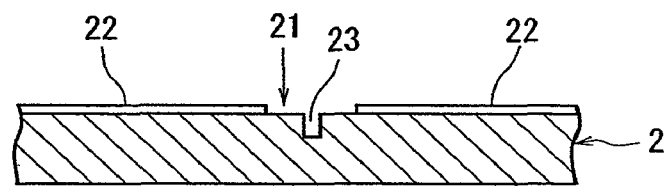

After the chuck table 61 is positioned right below the image pick-up means 63, the alignment step for detecting the area to be cut of the semiconductor wafer 2 is carried out by the image pick-up means 63 and a control means that is not shown. That is, the image pick-up means 63 and the control means (not shown) carry out image processing such as pattern matching, etc. to align a dividing line 21 formed in a predetermined direction of the semiconductor wafer 2 with the cutting blade 621, thereby performing the alignment of the area to be cut (alignment step). The alignment of the area to be cut is also carried out on dividing lines 21 formed on the semiconductor wafer 2 in a direction perpendicular to the above predetermined direction. After the alignment of the area to be cut of the semiconductor wafer 2 held on the chuck table 61 is carried out as described above, the chuck table 61 holding the semiconductor wafer 2 is moved to the cutting start position of the area to be cut. To carry out the cutting-in feed of a predetermined amount, the cutting blade 621 is moved down a predetermined distance for cutting while it is rotated in the direction indicated by the arrow. As for this cutting position, the outer peripheral end of the cutting blade 621 is set to a depth (for example, 100 μm) corresponding to the final thickness from the front surface of the semiconductor wafer 2. After the cutting blade 621 is moved down (cutting-in fed) for cutting as described above, the chuck table 61 is moved (cutting-fed) in the direction indicated by the arrow X while the cutting blade 621 is being rotated to form a dividing groove 23 having a depth (for example, 100 μm) corresponding to the final thickness of each device along the predetermined dividing line 21, as shown in FIG. 9(b). This dividing groove forming step is carried out along all the dividing lines 21 formed on the semiconductor wafer 2.

The above dividing groove forming step is followed by the above protective film forming step and the flattening step.

Figure 10:
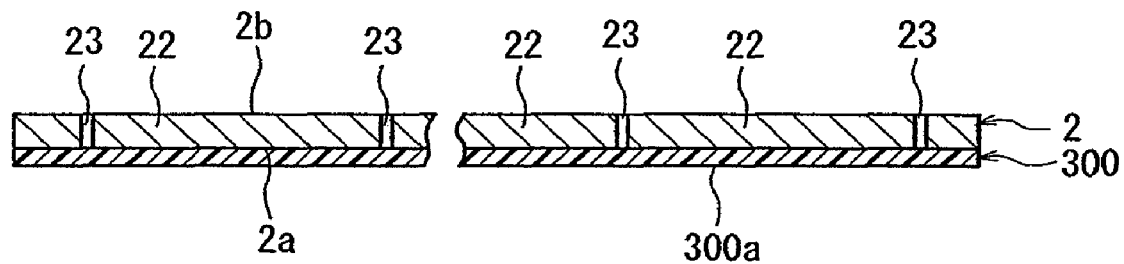
FIG. 10 is an enlarged sectional view of the semiconductor wafer which has been subjected to the rear surface grinding step in the second embodiment of the wafer grinding method of the present invention.

Next, the above rear surface grinding step is carried out to expose the dividing grooves 23 formed in the above dividing groove forming step to the rear surface 2b of the semiconductor wafer 2, thereby dividing the semiconductor wafer 2 into individual devices 22 along the plurality of dividing lines 21, as shown in FIG. 10. Although the semiconductor wafer 2 is divided into individual devices 22 along the plurality of dividing lines 21 as shown in FIG. 10, as the protective film 300 is formed on the front surface 2a of the semiconductor 2, the devices 22 do not fall apart and the state of the semiconductor wafer 2 is maintained. Since the front surface 300a of the protective film 300 placed on the chuck table 51 has been made flat by the above flattening step as described above, the rear surfaces of the individual devices 22 are ground flat in this rear surface grinding step. After this rear surface grinding step, the individual devices can be obtained by carrying out the step of removing the protective film 300 formed on the front surface 2a of the semiconductor wafer 2.

A description will be subsequently given of a third embodiment of the wafer grinding method of the present invention.

Figure 11:
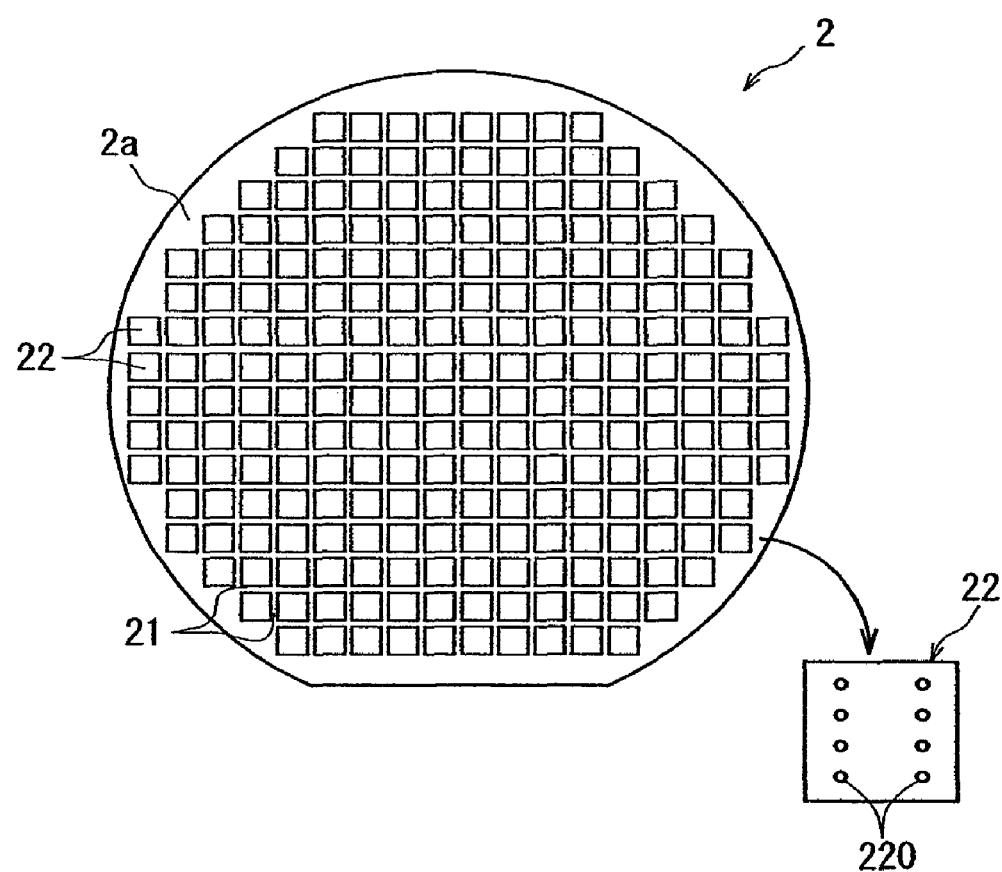
FIG. 11 is a plan view of a semiconductor wafer to be processed by a third embodiment of the wafer grinding method of the present invention.

The third embodiment of the wafer grinding method is a method of grinding a wafer having a plurality of stud bumps (electrodes) 220 which are formed on the plurality of devices 22 on the semiconductor wafer shown in FIG. 1 as shown in FIG. 11.

Figure 12:
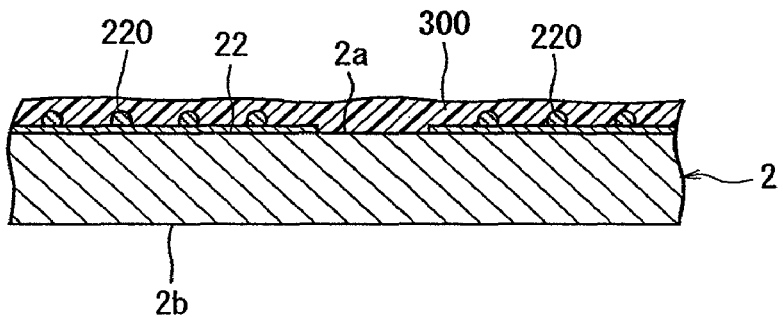
FIG. 12 is an enlarged sectional view of the semiconductor wafer which has been subjected to the protective film forming step in the third embodiment of the wafer grinding method of the present invention.

In the third embodiment of the wafer grinding method, the above protective film forming step is first carried out by using an underfill material such as an epoxy resin to form a protective film 300 on the front surface 2a of the semiconductor wafer 2, as shown in FIG. 12. This protective film 300 is formed thick enough to cover the stud bumps (electrodes) 220 on the front surfaces of the devices 22. The front surface 300a of the protective film 300 formed on the front surface 2a of the semiconductor wafer 2 in the protective film forming step is not flat.

Figure 13:
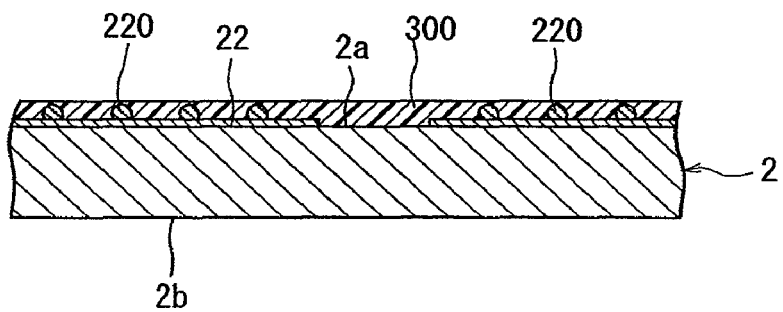
FIG. 13 an enlarged sectional view of the semiconductor wafer which has been subjected to the flattening step in the third embodiment of the wafer grinding method of the present invention.

After the above protective film forming step, the above flattening step is carried out to flatten the front surface 300a of the protective film 300 formed on the front surface 2a of the semiconductor wafer 2, as shown in FIG. 13. At this point, to prevent the contamination of the stud bumps (electrodes) 220 formed on the front surfaces of the devices 22, the stud bumps (electrodes) 220 should not be exposed to the front surface 300a of the protective film 300.

Figure 14:
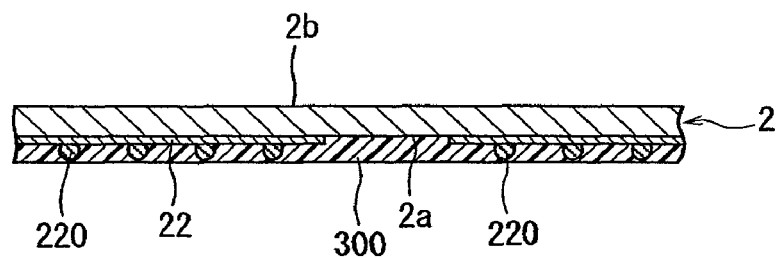
FIG. 14 is an enlarged sectional view of the semiconductor wafer which has been subjected to the rear surface grinding step in the third embodiment of the wafer grinding method of the present invention.

After the above flattening step, the rear surface grinding step is carried out to grind the rear surface 2b of the semiconductor wafer 2 to a predetermined thickness, as shown in FIG. 14. Since the front surface 300a of the protective film 300 placed on the chuck table 51 has been made flat by the above flattening step, the rear surface 2b of the semiconductor wafer 2 is ground flat in this rear surface grinding step.

Figure 15:
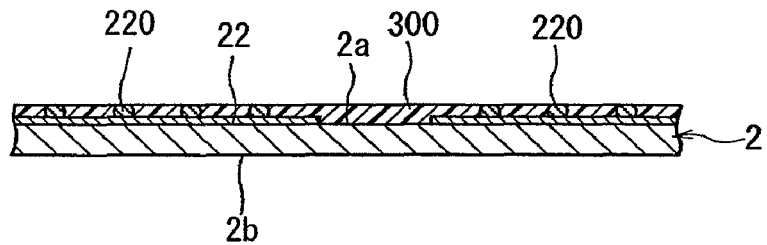
FIG. 15 is an enlarged sectional view of the semiconductor wafer which has been subjected to an electrode exposing step in the third embodiment of the wafer grinding method of the present invention.

Next comes the step of exposing the stud bumps (electrodes) 220 formed on the front surfaces of the devices 22 by scraping the front surface 300a of the protective film 300 formed on the front surface 2a of the semiconductor wafer 2. This electrode exposing step is carried out by using the above scraping machine 4 shown in FIG. 4 and making the feed amount of the scraping means 42 larger than that of the above flattening step. As a result, as shown in FIG. 15, the stud bumps (electrodes) 220 formed on the front surfaces of the devices 22 are exposed to the front surface 300a of the protective film 300 formed on the front surface 2a of the semiconductor wafer 2. The semiconductor wafer 2 which has been subjected to the electrode exposing step as described above is divided into individual devices in the subsequent dividing step. The stud bump (electrode) 220 sides of the individual devices are mounted on a wiring board, and the protective film 300 (underfill material) fills the gap between the wiring board and each device.

What is claimed is:

1. A method of grinding a rear surface of a wafer having a plurality of dividing lines which are formed in a lattice pattern on a front surface and devices which are formed in a plurality of areas sectioned by the plurality of dividing lines, comprising:

forming a protective film by coating the front surface of the wafer with a liquid resin;

drying the protective film such that the protective film is solidified;

scraping a front surface of the protective film formed on the front surface of the wafer with a rotary scraping tool to form the front surface of the protective film into a flat surface, wherein, as the rotary scrapping tool is rotated, a chuck table supporting the wafer is moved horizontally to flatten the front surface of the protective film; and placing the protective film side of the wafer on a holding surface of the chuck table and grinding the rear surface of the wafer with a grinder to a predetermined thickness.

2. The wafer grinding method according to claim 1, further comprising forming a dividing groove having a depth corresponding to the final thickness of each device along the plurality of dividing lines on the front surface side of the wafer is carried out before forming the protective film, wherein the formation of the protective film and forming the front surface of the protective film into a flat surface are then carried out, and the dividing grooves are exposed to the rear surface of the wafer in the grinding of the rear surface to divide the wafer into individual devices along the plurality of dividing lines.

3. The wafer grinding method according to claim 1, further comprising removing the protective film formed on the front surface of the wafer after the grinding of the rear surface.

4. A method of grinding a rear surface of a wafer having a plurality of dividing lines which are formed in a lattice pattern on a front surface, devices which are formed in a plurality of areas sectioned by the plurality of dividing lines and a plurality of electrodes which are formed on each of the devices, comprising:

forming a protective film thick enough to cover the electrodes by coating the front surface of the wafer with a liquid resin;

drying the protective film such that the protective film is solidified;

scraping a front surface of the protective film formed on the front surface of the wafer with a rotary scraping tool to form the front surface of the protective film into a flat surface from which the electrodes are not exposed, wherein, as the rotary scrapping tool is rotated, a chuck table supporting the wafer is moved horizontally to flatten the front surface of the protective film;

placing the protective film side of the wafer on a holding surface of the chuck table for holding a wafer and grinding the rear surface of the wafer with a grinder to a predetermined thickness; and scraping the front surface of the protective film formed on the front surface of the wafer to expose the electrodes after the grinding of the rear surface.

5. The wafer grinding method according to claim 2, further comprising removing the protective film formed on the front surface of the wafer after the grinding of the rear surface.

* * * * *